United States Patent
Bhattacharya et al.

(10) Patent No.: US 8,513,050 B1
(45) Date of Patent: Aug. 20, 2013

(54) BI-SE DOPED WITH CU, P-TYPE SEMICONDUCTOR

(75) Inventors: Raghu Nath Bhattacharya, Littleton, CO (US); Sovannary Phok, Lakewood, CO (US); Philip Anthony Parilla, Lakewood, CO (US)

(73) Assignee: U.S. Department of Energy, Washington, DC (US)

( * ) Notice: Subject to any disclaimer, the term of this patent is extended or adjusted under 35 U.S.C. 154(b) by 434 days.

(21) Appl. No.: 12/815,585

(22) Filed: Jun. 15, 2010

(51) Int. Cl.
H01L 21/00 (2006.01)

(52) U.S. Cl.
USPC .............. 438/95; 438/102; 438/103; 257/42; 257/43; 257/414

(58) Field of Classification Search
USPC ................ 438/95, 102, 103; 257/43, 42, 414
See application file for complete search history.

(56) References Cited

U.S. PATENT DOCUMENTS

2006/0096537 A1* 5/2006 Tuttle ........................... 118/720
2012/0001117 A1* 1/2012 Haa et al. ...................... 252/71

OTHER PUBLICATIONS

Karup-Moller, S., The Cu-Bi-Se phase system at temperature between 300 and 750 C, 2003, E. Schweizerbart'sche Verlagsbuchhandlung, pp. 556-576.*

* cited by examiner

Primary Examiner — Julio J Maldonado
Assistant Examiner — Hajar Kolahdouzan
(74) Attorney, Agent, or Firm — Michael J. Dobbs; Daniel D. Park; John T. Lucas

(57) ABSTRACT

A Bi—Se doped with Cu, p-type semiconductor, preferably used as an absorber material in a photovoltaic device. Preferably the semiconductor has at least 20 molar percent Cu. In a preferred embodiment, the semiconductor comprises at least 28 molar percent of Cu. In one embodiment, the semiconductor comprises a molar percentage of Cu and Bi whereby the molar percentage of Cu divided by the molar percentage of Bi is greater than 1.2. In a preferred embodiment, the semiconductor is manufactured as a thin film having a thickness less than 600 nm.

19 Claims, 2 Drawing Sheets

BI-SE DOPED WITH CU, P-TYPE SEMICONDUCTOR

GOVERNMENT INTERESTS

The United States Government has rights in this invention pursuant to Contract No. DE-AC36-98G010337, between the U.S. Department of Energy (DOE) and the Midwest Research Institute.

CROSS-REFERENCE TO RELATED APPLICATIONS

Not Applicable

FIELD OF THE INVENTION

The present invention relates to a low-cost p-type semiconductor. More particularly, the present invention relates to a Bi—Se doped with Cu, p-type semiconductor, preferably for use in photovoltaic devices.

BACKGROUND OF THE INVENTION

Although photovoltaic devices are poised to provide clean renewable energy for the future, production costs have limited the potential of this technology. Photovoltaics convert light into usable electricity using the "photovoltaic effect." Briefly, two basic steps are involved in the photovoltaic effect. Initially, light is absorbed by an absorber material, a semiconductor. The absorption of the light generates electrons and holes. Secondly, the electrons and holes are separated by a built in electric field, for example a p-n junction. The electrons generated at the p-n junction flow towards the n-type material, which can be captured as produced electricity.

The primary semiconductor absorber materials generally found in existing photovolatics currently employ materials such as amorphous silicon (a-Si), copper indium gallium diselenide (CIGS) and cadmium telluride (CdTe). These materials have well-known drawbacks including the employment of toxic, nonabundant and expensive raw materials that limit their successful commercial deployment. Therefore, there exists a need in the art for a suitable absorber material that is made of abundant and low cost materials that are nontoxic.

SUMMARY OF THE INVENTION

A Bi—Se doped with Cu, p-type semiconductor, preferably used as an absorber material in a photovoltaic device. Preferably the p-type semiconductor has at least 20 molar percent of Cu. In a preferred embodiment, the p-type semiconductor comprises at least 28 molar percent of Cu. In one embodiment, the p-type semiconductor comprises a molar percentage of Cu and Bi whereby the molar percentage of Cu divided by the molar percentage of Bi is greater than 1.2. In one embodiment, the p-type semiconductor comprises Se having a molar ratio greater than 61 percent and Bi having a molar ratio greater than 17 percent. In a preferred embodiment, the p-type semiconductor is manufactured in as a thin layer (thin film) having a thickness less than 600 nm.

The p-type semiconductor may be fabricated using various fabrication techniques including, but are not limited to, physical vapor deposition, sputtering, solution based methods such as sol-gel, inkjet, metal organic deposition, etc. Preferably, the p-type semiconductor is fabricated as a layer by electrodeposition to minimize impurities in the p-type semiconductor.

Preferably, the p-type semiconductor is used as a material to create various semiconductor electronics, for example, transistors (e.g. BJT, MOSFET, etc.), solar cells, diodes, light-emitting diode, silicon controlled rectifier, digital and analog integrated circuits, thermoelectric devices and quantum computing devices. More preferably, the p-type semiconductor is used as a material to create photovoltaic devices.

DETAILED DESCRIPTION OF THE INVENTION

Figure 1:
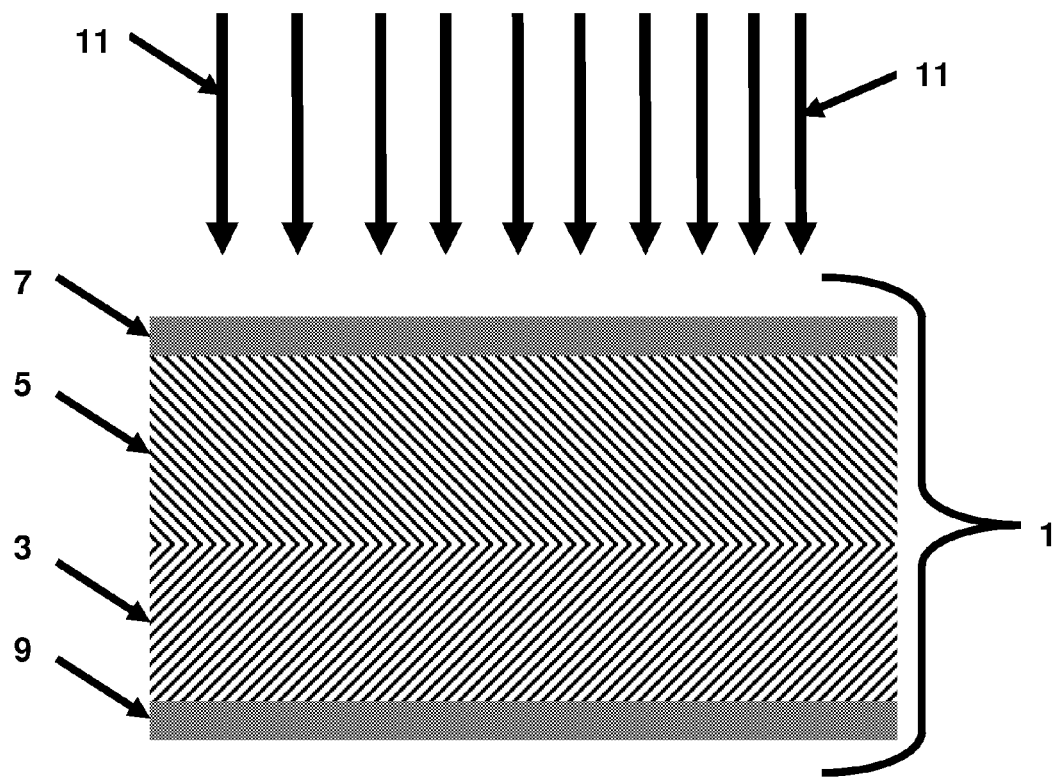
FIG. 1 shows one embodiment of a photovoltaic device using a Bi—Se doped with Cu, p-type semiconductor.

A Bi—Se doped with Cu, p-type semiconductor, preferably used as an absorber material in a photovoltaic device. Preferably the p-type semiconductor has at least 20 molar percent of Cu. In a preferred embodiment, the p-type semiconductor comprises at least 28 molar percent of Cu. In one embodiment, the p-type semiconductor comprises a molar percentage of Cu and Bi whereby the molar percentage of Cu divided by the molar percentage of Bi is greater than 1.2. In one embodiment, the p-type semiconductor comprises Se having a molar ratio greater than 61 percent and Bi having a molar ratio greater than 17 percent. In a preferred embodiment, the p-type semiconductor is manufactured as a thin layer (thin film) having a thickness less than 600 nm.

The p-type semiconductor may be fabricated using various fabrication techniques including, but are not limited to, physical vapor deposition, sputtering, solution based methods such as sol-gel, inkjet, metal organic deposition, etc. Preferably, the p-type semiconductor is fabricated as a layer by electrodeposition to minimize impurities in the semiconductor.

Preferred embodiments of the p-type semiconductor doped with Cu include, but are not limited to:

a. 28.4 mole percent of Cu, 19.0 mole percent of Bi, and 52.5 mole percent of Se;
b. 27.6 mole percent of Cu, 19.9 mole percent of Bi, and 52.4 mole percent of Se;
c. 27.4 mole percent of Cu, 20.2 mole percent of Bi, and 52.4 mole percent of Se;
d. 27.4 mole percent of Cu, 16.3 mole percent of Bi, and 56.2 mole percent of Se;
e. 26.9 mole percent of Cu, 17.1 mole percent of Bi, and 55.9 mole percent of Se;
f. 22.1 mole percent of Cu, 18.3 mole percent of Bi, and 59.5 mole percent of Se; and
g. 21.6 mole percent of Cu, 17.6 mole percent of Bi, and 60.8 mole percent of Se.

Preferably, the p-type semiconductor is used as a material to create various semiconductor electronics, for example, transistors (e.g. BJT, MOSFET, etc.), solar cells, diodes, light-emitting diode, silicon controlled rectifier, digital and analog integrated circuits, thermoelectric devices and quantum computing devices. More preferably, the p-type semiconductor is used as a material to create photovoltaic devices. Preferably, the p-type semiconductor is used with a combination of one or more other semiconductors. For example, in one embodiment, the p-type semiconductor is deposited onto a substrate with one or more other layers (e.g. p-type semiconductors, n-type semiconductors, electrodes, insulators, resistors, etc.). In yet another embodiment, the p-type semiconductor is deposited onto a substrate with one or more other layers, including various techniques for creating patterned layers (e.g. partial layer remove using patterns). In one embodiment, a substrate has a layer made of the p-type semiconductor and a second layer made of a high band n-type semiconductor layer (e.g. CdS, ZnS, Zn(O,OH)S, CdZnS, Cd(O,OH)S, In—S, In(OH)S and other window layers) creating a photovoltaic cell, a diode, forming one or more parts of a transistor, or other electrical devices.

The substrate is any surface capable of maintaining the structural integrity of the deposited layers, while also preferably bonding to the layers. Preferably, the substrate is made of glass; transparent conducting layers: indium tin oxide (ITO), gallium doped indium tin oxide, fluorine doped tin oxide, zinc oxide, doped zinc oxide, carbon nanotube networks, graphene, networks of polymers (e.g. poly-3,4-ethylenedioxythiophene, polyacetylene, polyaniline, polypyrrole) and its derivatives, or combinations thereof; metallic: stainless steel, aluminum, nickel, nickel-tungsten alloys, copper, silver, gold, platinum, molybdenum, biaxially textured metallic with a preferential grain orientation (e.g. stainless steel, aluminum, nickel, nickel-tungsten alloys, copper, silver, gold, platinum, molybdenum, or a combination thereof), polyester, poly-ethylen-terephtalate (PET), poly-ethylen-naphtalate (PEN), Polyether sulfones (PES), polyimide, or combinations thereof. In a preferred embodiment, the p-type semiconductor, one of the layers or a combination thereof is deposited on molybdenum (Mo) coated glass substrate. In a more preferred embodiment, the p-type semiconductor, one or the layers or a combination thereof is deposited on molybdenum (Mo) coated polymide substrate. In an alternate embodiment, the p-type semiconductor, one of the layer, or a combination thereof provide enough structural integrity to forgo the use of a separate substrate.

The produced p-type semiconductor has electrons missing from one of the covalent bonds normal for the material's lattice. Preferably, the p-type property of the semiconductor is determined directly by the electronic properties of the material. In the alternative, the p-type property of the semiconductor is determined by a positive hall-effect coefficient, a positive Seebeck coefficient, or a combination thereof.

Electrodeposition Fabrication

In a preferred embodiment, the p-type semiconductor is prepared using electrodeposition. In this embodiment, layers are deposited by dipping a substrate into an electrolytic bath and applying an electrical current across the substrate. In this embodiment, the substrate is preferably a Mo coated glass substrate or ITO coated glass substrate.

In one embodiment, the p-type semiconductor electrolytic bath contains 0.8 g to 6 g of bismuth nitrate hydrate, up to 0.3 g of copper nitrate hydrate, 3 to 5 g of lithium chloride and 0.1 to 0.5 g of seleneous acid dissolved in 200 mL of 3% nitric acid solution. The p-type semiconductor is preferably formed into a layer deposited on the substrate, preferably in air and at room temperature. In one embodiment, the substrate is a 7.5×2.5 $cm^2$ Mo coated glass substrate or ITO coated glass substrate in air and at room temperature. The electrodeposition is preferably performed at constant current ranging from 7 mA to 70 mA either with or without constant stirring in a two-electrode cell configuration containing a working electrode and a counter electrode. The deposition is preferably carried out for less than 40 minutes on the substrate, depending on the desired thickness. In a preferred embodiment, the deposition was performed for less than 5 minutes on the substrates, depending on the desired thickness.

Annealing

Preferably, the p-type semiconductor is annealed after deposition in order to promote good crystallinity and good phase formation. Preferably, the p-type semiconductor along with any substrate or other layers, are all annealed together. In a preferred embodiment, the p-type semiconductor is annealed at temperatures above 250° C. for 10 minutes to 5 hours. Preferably, the p-type semiconductor is exposed to a flowing noble gas, more preferably argon in presence of Se vapor. The annealing conditions are optimized by various factors, for example atmosphere, gas pressure, selenium vapor pressure and temperature. Preferably, the selenium vapor pressure during annealing is controlled by a selenium source in the form of either excess selenium in the layers (10 to 15 mole percent of Se), or elemental selenium powder (0.5 to 3 mg) or $Bi_2Se_3$ powder (0.5 to 3 mg) or $H_2Se$ or Se-vapor in vacuum chamber or diethyl selenide or any other selenium source.

Preferably, annealing of the p-type semiconductor is performed in a thermal reactor. The thermal reactor is preferably either a tubular resistive furnace containing a quartz tube where the ex-situ annealing is carried out, or a pressurized and sealed evaporation chamber with a resistive heater, a gas inlet and a gas outlet or in a vacuum chamber.

When using a tubular resistive thermal reactor, the gas pressure is preferably set at 1 atmosphere with a noble gas, preferably flowing in the range of 0.25 to 0.5 l/min. More preferably, when using a tubular resistive thermal reactor the gas pressure is set at 1 atmosphere with argon gas.

When using an evaporation chamber, a noble gas, preferably argon, flow is preferably controlled in a way that the internal gas pressure in the reactor is in the range of 1 to 50 milli-Torr. Ex-situ annealing is preferably performed using a flowing noble gas to improve the phase formation and the electrical properties of the layers. In a preferred embodiment, ex-situ annealing is performed at 400-450° C. for 2 to 5 hours in flowing noble gas, preferably argon gas.

Chemical Bath Deposition Fabrication

In one embodiment, the p-type semiconductor is prepared using chemical bath deposition. In a preferred embodiment, the p-type semiconductor is prepared from a solution containing bismuth nitrate, copper nitrate and sodium selenosulfate ($Na_2SeSO_3$). Preferably, the deposition temperature is in the range of 40° C. to 60° C.

In one embodiment of chemical bath deposition, a reacting solution is created by the mixture of two solutions, solution A and a solution B into an aqueous mixture. Preferably solution A is a mixture of bismuth ($Bi^{2+}$) nitrate and copper ($Cu^{2+}$) nitrate. In a preferred embodiment, Solution A totals 5 to 10 ml and contains 11 mM/l of bismuth ($Bi^{2+}$) nitrate and up to 30 mM/l of copper ($Cu^{2+}$) nitrate. Preferably, solution A has a Cu concentration in the range of 20 to 30 mM/l.

Preferably, solution B is a mixture of seleneous (Se) compounds. In a preferred embodiment, solution B totals 20 to 35 ml and contains 50 mM/l seleneous (Se) compounds. Preferably, p-type semiconductor layers with compositions up to 28 mole percent of copper are prepared by varying copper concentration in the solution A from 0 mM/l to 30 mM/l.

The pH of the reacting solution is preferably maintained in the range of 8 to 9. In one alternate embodiment, sodium hydroxide (NaOH) and/or ammonium hydroxide ($NH_4OH$) is used to increase the pH up to 12. $Cu_xBi_ySe_z$ layers are deposited on substrates at temperature in the range of room temperature (25° C.) to 100° C. In this process, selenium (II) is reacted with sodium sulfite ($Na_2SO_3$) to produce sodium selenosulfate ($Na_2SeSO_3$) while triethanolanime (TEA) is used as a chelating agent to dissolve bismuth (III) in the reacting solution.

The substrate is any surface capable of bonding to the layers. Preferably, the substrate is optically flat. The substrate is preferably corning glass. The substrate is preferably cleaned in soap, washed in water and subsequently in isopropanol.

The layers are preferably prepared by a multiple-dip process for obtaining micron-thick layers. For every dip, a new mixture with solution A and B is preferably prepared. Preferably, each deposition is carried out for 30 minutes. After every deposition, the layer is preferably washed with water and blown dry preferably with nitrogen gas. The deposition conditions, e.g. elemental concentration, solution volume, temperature and time are preferably optimized for (i) adhesion of the particles on substrate, (ii) minimal degradation of the layers by the solution in the subsequent dips, (iii) large aerial composition homogeneity and (iv) thickness homogeneity in the layer.

$Bi_2Se_3$ semiconductors doped with Cu are preferably prepared by chemical bath deposition, following the overall chemical reaction 1:

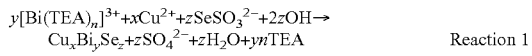
$$y[Bi(TEA)_n]^{3+}+xCu^{2+}+zSeSO_3^{2-}+2zOH^- \rightarrow Cu_xBi_ySe_z+zSO_4^{2-}+zH_2O+ynTEA \qquad \text{Reaction 1}$$

Where TEA is an abbreviation for Triethanolamine, a chelating agent used in this case to dissolve Bismuth cations in aqueous solution.

Table 1 lists sample embodiments that were prepared using chemical deposition. As shown, each semiconductor layer is listed with the following columns in the following order, sample name, composition (mole percentages of Cu, Bi and Se), Cu/Bi ratio, layer thickness, determined semiconductor type by Hall coefficient and/or Seebeck coefficient, and thermal treatment. The layers were prepared by chemical bath deposition as described above at temperature of 40° C.-50° C. Layers were deposited from 9 hours to 35 hours. Copper rich layers are deposited for longer time than bismuth rich layers. As examples, the $Bi_{31}Se_{69}$ layer was deposited for 9 hours while $Cu_{21.6}Bi_{17.6}Se_{60.8}$ and $Cu_{28.4}Bi_{19}Se_{52.5}$ layers were deposited for 22 hours and 35 hours, respectively.

Composition mole percentages were determined using x-ray fluoroscopy (XRF) having a resolution of ±1 mole percentage for Cu; ±1 mole percentage for Bi; and ±2 mole percentage for Se. Therefore, all values listed include at least a variance of ±1 mole percentage for Cu; ±1 mole percentage for Bi; and ±2 mole percentage for Se.

The Hall coefficient are deduced from Hall-effect measurements performed in the dark and at room temperature by the Van der Pauw Hall method with four probes on 1 cm² layers using an Accent machine. Indium metal dots are used as contact materials. The Hall-effect characterizes a sample of semiconductor material. The measurement of the Hall coefficient can be successfully completed with a current source, voltmeter, and a magnet. From the measurements made, the following properties of the material were calculated: (i) the sheet resistance, from which the resistivity can be inferred for a sample of a given thickness; (ii) the doping type (i.e. if it is a p-type or n-type) material deduced from the sign of the coefficient; (iii) the sheet carrier density of the majority carrier (the number of majority carriers per unit area); (iv) the mobility of the majority carrier.

NSC is an abbreviation for not significant coefficient. NP is an abbreviation for not performed because the Hall measurement gave a significantly negative coefficient.

The Seebeck coefficients were determined from electrical measurements performed in the dark with two probes on a 0.5×0.8 cm² layers. The Seebeck coefficient is a thermoelectric measure of the magnitude of voltage produced by a temperature gradient across a material. In semiconductors, temperature differences induce majority carriers (holes for p-type or electrons for n-type) to diffuse from the hotter area of the gradient to the cooler area. The movement of carriers creates a DC potential, namely the Seebeck coefficient; for electrons, the voltage or coefficient is negative and for holes, this is a positive voltage. The Seebeck measurement setup is constituted of a heater and a split ferromagnetic chuck to create a temperature gradient on the semiconducting layers. In general, Seebeck measurements are known to be more sensitive to the carrier movement than Hall measurements.

TABLE 1

Sample Embodiments.

| Sample | Composition | | | Cu/Bi Ratio | Thickness | Semiconductor Type | Hall ($m^2$/C) | Seebeck (mV/K) | Thermal Treatment |
| | % Cu | % Bi | % Se | | | | | | |
|---|---|---|---|---|---|---|---|---|---|
| S090730-2 | 28.4/ | 19.0 | /52.5 | 1.50 | 563 nm | p | +0.006 | +22.2(±0.8) | 350° C. |
| S090730-3 | 27.6/ | 19.9 | /52.4 | 1.39 | 598 nm | P | +0.009 | +13.7(±0.6) | 400° C. |
| S090730-1 | 27.4/ | 20.2 | /52.4 | 1.36 | 607 nm | p | +0.009 | +16.3(±1) | 450° C. |
| S081209-1An2 | 27.4/ | 16.3 | /56.2 | 1.68 | 298 nm | p | NSC | +9.8(±0.6) | 250° C. |
| S081209-1An1 | 26.9/ | 17.1 | /55.9 | 1.57 | 347 nm | p | NSC | +8.9(±0.6) | 250° C. |
| S081203-An6 | 22.1/ | 18.3 | /59.5 | 1.21 | 269 nm | p | NSC | +96.6(±0.7) | 250° C. |
| S081203-1An2 | 21.6/ | 17.6 | /60.8 | 1.23 | 278 nm | p | NSC | +88.3(±0.7) | 250° C. |
| S090915-1 | 17.6/ | 23.9 | /58.4 | 0.74 | 344 nm | n | −0.07 | −18.4(±0.7) | 420° C. |
| S081124-An1 | 11.2/ | 26.8 | /62 | 0.42 | 467 nm | n | −1.26 | NP | 250° C. |
| S081030-An1 | 7.2/ | 28.8 | /64 | 0.25 | 576 nm | n | −0.06 | NP | 250° C. |
| S091016-1An | 4.6/ | 33.7 | /61.7 | 0.14 | 552 nm | n | −0.11 | NP | 450° C. |
| S090410-1An | 0/ | 31 | /69 | 0 | 338 nm | n | −3.4 | NP | 250° C. |

Solid-State Synthesis of Bulk Crystals

In one embodiment, the p-type semiconductor is prepared using solid-state synthesis. In one embodiment, the p-type semiconductor is prepared using solid-state synthesis starting from $Cu_2Se$ (99% pure) and $Bi_2Se_3$ (99% pure) powders. In another embodiment, the p-type semiconductor is prepared using solid-state synthesis starting from Cu (99% pure), Bi (99% pure) and Se (99% pure) powders. After mixing, grinding and pressing the powders into a pellet in the desired ratio, annealing is preferably performed in a one-zone or three-zone tube furnace in flowing gas, more preferably argon gas, or in sealed quartz tubes preferably containing a noble gas, more preferably a 0.5 bar argon gas.

The annealing is preferably carried out at temperature above 400° C. up to 750° C. for 2 to 24 hours. A slow cooling rate of 1° C./min is preferably applied to promote the growth of large crystals. Layers are preferably made by cleaving the crystals either mechanically or chemically creating bulk samples.

For example, in one embodiment, bulk samples are mechanically sliced with either a diamond saw or a laser beam perpendicularly to the growth axis to yield layers. In another embodiment, the bulk sample is chemically sliced by a slurry containing oxidants (such as potassium permanganate, hydrogen peroxide, nitric acid, bromine), strong acids (hydrofluoric acid, hydrobromic acid, hydrochloric acid, phosphoric acid) and medium reagents (water, acetic acid, alcohols).

Thermal Evaporation

In one embodiment, the p-type semiconductor is prepared by thermal evaporation, whereby a boat containing a powder mixture is heated in a sealed deposition chamber causing the mixture to evaporate. The evaporated mixture then condenses onto the substantially cooler substrate. The boat is preferably made of tungsten or molybdenum. The boat is heated until the powder mixture is evaporated. Preferably, the heated powder mixture is the desired p-type semiconductor composition. In a preferred embodiment, the heated powder mixture is $Bi_2Se_3$ and $Cu_2Se$ powders or Cu, Bi and Se powders, more preferably a mixture described above in table 1. The pressure within the deposition chamber is preferably in the range of $10^{-5}$ or $10^{-4}$ Torr, to minimize reaction between the vapor and the atmosphere.

Preferably, the boat is heated using either resistance heating (Joule effect) or bombardment with a high energy electron beam, preferably several KeV, from an electron beam gun (electron beam heating). Preferably, the evaporated mixture is deposited through condensation on the substrate as layers. The layers are preferably deposited on a substrate kept at room temperature. The evaporation rates as well as the thickness are preferably controlled by a quartz crystal monitor. The deposition rate is preferably in the range of 0.1 nm/s to 5 nm/s. The distance between the boat and the substrate is preferably in the range of 5 cm to 20 cm, more preferably about 10 cm. Afterwards, the layers are then preferably annealed, preferably at temperature above 250° C. for 10 minutes to 5 hours in flowing gas, preferably argon gas, for good crystallinity and good phase formation as described above.

Pulse Laser Deposition

In one embodiment, the p-type semiconductor is prepared by Pulse Laser Deposition. In pulse laser deposition, a target made of the desired layer composition is sealed within a deposition chamber and bombarded by a high-energy source, preferably electrons or photons (e.g. laser).

Preferably, the target is made by annealing the powder as described in above for Solid-State Synthesis of Bulk Crystals. The target is preferably loaded in a stage that is rotated about normal to the surface of the substrate. The center of the target preferably coincides with the center of the substrate. Preferably, the distance between the target and the substrate is in the range of 3 to 10 cm. Preferably, the optimum distance between the target and the substrate is about 4 to 5 cm, depending on the size of the resulting plasma plume.

In a preferred embodiment, the deposition chamber is a standard Neocera Pulse Laser Deposition chamber and the high-energy source is an excimer KrF laser (Lambda Physik, Compex 201, λ=248 nm) operated at 260 mJ and in the frequency range of 1 Hz to 20 Hz. Preferably, the laser beam produced by this high-energy source is focused onto the target with a converging lens. Preferably, the laser beam is incident on the target at 45 degrees. The laser beam is preferably focused onto a 3×1 $mm^2$ spot on a target with a fluence of 0.1-3 $J/cm^2$.

The surface of each target is preferably cleaned in situ by exposure to thousand laser shots prior to every deposition. The target is preferably rotated in order to avoid non-stoichiometry resulting from localized evaporation from the same region in the target. During the deposition, the substrate is preferably heated, more preferably to a temperature up to 500° C. In one embodiment, the substrate is heated using Joule effect heating, although other heating means may also be used. The pressure inside the deposition chamber is preferably kept at 1 to 5 mTorr with a flowing noble gas, preferably argon.

Layers deposited either at low temperatures (for example, room temperature), at low fluences (for example 0.15 $J/cm^2$) or at high frequencies (for example, 20 Hz), are preferably subsequently annealing in situ (in the deposition chamber) or ex situ (in a tube furnace) as described above. Preferably, such layers are annealed at temperatures above 250° C.

Metalorganic Chemical Vapor Deposition

In one embodiment, the p-type semiconductor is prepared by metalorganic chemical vapor deposition. In this embodiment, the process is based on the use of organometallic precursors to deposit p-type semiconductor layers. Preferably, the precursors are one or more metal alkyls. The basic reactions for the growth of compound semiconductors starting from organometallic compounds are as follows: $R_nM+R'_nX \rightarrow MX+n[R-R']$. In the case of Cu—Bi—Se layers, the reaction follows reaction 2:

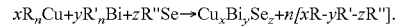

$$xR_nCu+yR'_nBi+zR''Se \rightarrow Cu_xBi_ySe_z+n[xR-yR'-zR''].$$

In this embodiment, the system generally consists of three sub-systems: the reactor vessel, the gas mixing manifold and the heat source. The reactor vessel is preferably a horizontal, low pressure and cold-wall reactor. The horizontal design of the reactor vessel is advantages as it helps provide a uniform and controlled gas flow over the substrate and provides for a direct extension for large volume applications. The gas mixing manifold is preferably fully automated with sealed valves and electronic mass flow controllers. The substrate is preferably either heated by inductively coupling RF (radio frequency) power or by UV (Halogen lamp) at temperature above 250° C.

After the precursors, in a liquid form, are injected in a vaporization chamber towards injectors, the precursor vapors are transported by a gas, preferably argon gas, to the substrate. The pressure inside the reactor is preferably kept at 100 to 500 Torr. The gas flow in the reactor is preferably highly laminar at optimum growth rate. Solvents used to dissolve the organics preferably include toluene, tetrahydrofuran, dichloromethane, chloroform, 2-Methyltetrahydrofuran, etc. . . . Organometallics employed in the process preferably include dimethyl selenide, diethyl selenide, tertbutyl selenide, diisopropyl selenide, bis(ethylisobutrylacetato)copper, bis(ethylbutyrylacetato)copper, copper diselenophosphate, copper imidodiselenophosphinate, copper hexafluoroacetylacetonate, trimethyl bismuth, bis(bis(trimethylsilyl)methyl) bismuth, tert butyl imido tris (diethyl amido) bismuth, diseleno imido diphoshanto bismuth, etc. . . . In a preferred embodiment, Bi—Se films doped with Cu are deposited from diseleno imido diphoshanto bismuth and copper diselenophophate precursors dissolved in tetrahydrofuran solvent.

Spray Deposition

In one embodiment, the p-type semiconductor is prepared by spray deposition. The spray system in spray deposition is preferably constituted of 3 basic units: (i) the generation of the spray, (ii) the spray transport unit and (iii) the deposition chamber. This embodiment is advantageous for high volume deposition since the system can be extended by including an additional unit: a roll-to-roll system for deposition on kilometer long tape substrate.

A solution, either organic or aqueous is preferably introduced in the spraying reactor by injection. The spray is preferably produced by a piezoelectric ceramic nozzle. In a preferred embodiment, the spray is produced by a piezoelectric ceramic nozzle vibrating at frequency in the range of 800 kHz to 1200 kHz. The size of the droplets produced by the nozzle depends considerably on the vibrating frequency. In a preferred embodiment, the spray is produced by a piezoelectric ceramic nozzle vibrating at high frequency of 1200 kHz generating small droplets capable of producing uniform layers.

One embodiment of the spray transport unit is a tube. Preferably, the tube is a quartz tube having a dimension designed to produce a laminar spray flow at proximity of the substrate. Preferably, the diameter of the tube is about 1-2 cm. The distance between the tube and the substrate is preferably kept in the range of 2 cm to 15 cm.

Preferably, a noble gas, more preferably argon, is used as a deposition gas. Preferably, a noble gas, more preferably argon is used as the transport during deposition. The substrate is sprayed preferably for about a 5 to 20 minutes deposition time thereby providing for layers with thickness up to 1 µm. Preferably, during deposition, the substrate is maintained at a temperature up to 800° C. Preferably, the deposition is performed at low temperatures in the range of 25° C. to 300° C. to avoid the loss of selenium.

Preferably, an ex-situ or in-situ annealing in the deposition chamber is carried out to achieve better crystallinity and phase formation as described above. The aqueous spray solution is preferably a mixture of bismuth nitrate hydrate, copper nitrate hydrate, lithium chloride and seleneous acid. Preferably the spray solution is dissolved in 200 mL of 3% nitric acid solution. When using an organic solution, the viscosity plays an important role for obtaining uniform layer. The viscosity of the organic solution using solvents such as ethanol, isopropanol, toluene, tetrahydrofuran, dichloromethane, chloroform, 2-Methyltetrahydrofuran, etc . . . is preferably in the range of 1 to 5 centipoises. Metallorganics employed for the deposition of Cu—Bi—Se is preferably similar to the one listed for Metal Organic Chemical Vapor Deposition above.

Ink-Jet Printing

In one embodiment, the p-type semiconductor is prepared by ink-jet printing. In this embodiment, the system is comprises of an ink reservoir, an automated ink-jet head (for example, a drop-on-demand nozzle) and a motion stage for supporting the substrate. Preferably, in this embodiment, the deposition is performed at room temperature and at ambient atmospheric pressure. A few milliliter of ink from the ink reservoir are prepared for each jetting session and expelled out the ink-jet head. The distance between the ink-jet head and the substrate is preferably optimized to few hundred micrometers (from 100 to 500 µm).

In a preferred embodiment, the ink-jet head is a piezoelectric nozzle, whereby a pulsed voltage (preferably with a period of few milliseconds) is applied to deposit droplets of ink onto the substrate. When the voltage is applied, the piezoelectric material changes shape, which generates a pressure pulse in the fluid forcing a droplet of ink from the nozzle. Preferably, the deposition time is about few minutes.

Preferably, either a solvent ink or an aqueous ink is employed. Solvent inks are preferably based on organic chemical compounds that have high vapor pressures such as aliphatic hydrocarbons, ethyl acetate, glycol ethers, formaldehyde, acetonitrile, dimethylsulfoxide and acetone. In one embodiment, the solvent ink used to deposit Cu—Bi—Se layers is a solution containing suspended $Bi_2Se_3$ and $Cu_2Se$ nanoparticles in acetonitrile. In yet, another embodiment the ink is prepared by dissolving bismuth nitrate, copper nitrate and seleneous acid in dimethylsulfoxide. Due to environmental issues, non-toxic solvent inks or aqueous inks are preferred. In a preferred embodiment, an aqueous ink employed for the deposition is prepared from bismuth nitrate, copper nitrate, seleneous acid, lithium chloride and nitric acid dissolved in water.

FIG. 1

FIG. 1 shows one embodiment of a photovoltaic device 1 using a Bi—Se doped with Cu, p-type semiconductor 3. In this embodiment, a Bi—Se doped with Cu, p-type semiconductor 3 is positioned juxtapose to an n-type semiconductor 5. A transparent electrically conductive material 7 is positioned juxtapose to the n-type semiconductor 5. A second electrically conductive material 9 is positioned juxtapose to the p-type semiconductor 3. Preferably, a third electrically conductive layer (not shown for simplicity) is positioned juxtapose to the transparent electrically conductive material 7. Light 11 from an external source (not shown for simplicity) will pass into the n-type semiconductor 5, p-type semiconductor 3, or a combination thereof. Preferably, the light 11 is solar radiation. However, any light source capable of absorption in the p-type semiconductor 3, the n-type semiconductor 5, or a combination thereof may be used.

Light is absorbed by an absorber material, the n-type semiconductor 5, the p-type semiconductor 3, or a combination thereof. The absorption of the light generates electrons and holes. The electrons and holes are separated by the built in electric field generated by the p-n junction of the n-type semiconductor 5 and the p-type semiconductor 3. The electrons generated at the p-n junction flow towards the n-type semiconductor, which can be captured as produced electricity at the transparent electrically conductive material 7 and the second electrically conducing material 9. Preferably, the transparent electrically conductive material 7 is optically transparent to allow for light to pass through.

Preferably, the p-type semiconductor is one of the numerous embodiments described above in table 1 and elsewhere. Preferably, the n-type semiconductor is a wide bandgap semiconductor with energy exceeding 2 eV, for example, but not limited to: doped bismuth selenide, zinc oxide, doped zinc oxide, titanium oxide, cadmium sulfide, doped cadmium sulfide, cadmium zinc sulfide, doped copper oxide, and combinations thereof. In one embodiment, the n-type semiconductor is a CdS, ZnS, Zn(O,OH)S, CdZnS, Cd(O,OH)S, In—S, In(OH)S and other wide band gap p-type semiconductors. In one embodiment, the n-type semiconductor is a Bi—Se doped with Cu, n-type semiconductor, whereby the molar ratio of Cu is less than or equal to 28 percent. In a preferred embodiment, the n-type semiconductor is a Bi—Se doped with Cu, n-type semiconductor, whereby the molar ratio of Cu is less than or equal to 20 percent.

The transparent electrically conductive material 7 and the second electrically conductive material 7 are any electrically conducting means. Preferably, the transparent electrically conductive material 7 is made of transparent conducting layers (e.g. indium tin oxide (ITO), gallium doped indium tin oxide, fluorine doped tin oxide, zinc oxide, doped zinc oxide, carbon nanotube networks, grapheme, networks of polymers and its derivatives, or combinations thereof. Preferably, the second electrically conductive material 7 is made of a electrically conducing metal, for example nickel, nickel-tungsten alloys, copper, silver, platinum, molybdenum, aluminum, gold or chromium gold alloys.

Preferably, a third electrically conductive layer (not shown for simplicity) is positioned juxtapose to the transparent electrically conductive material 7 and provides for easy, low electrical resistance connection. In a preferred embodiment, the third electrically conductive layer is made of a electrically conducing metal, for example nickel, nickel-tungsten alloys, copper, silver, platinum, molybdenum, aluminum, gold or chromium-gold alloys. In a more preferred embodiment, the third electrically conductive material has a width of a 3 microns to 1 mm and a length, 1 to 2 mm shorter than the cell length is deposited in the center of the device and on top of the transparent electrically conductive material 7 to collect the electrons from the transparent conducting layer as well as to provide an excellent contact with the outside electrical circuit.

In one embodiment, a substrate is used to provide structural support to the a photovoltaic device 1, thereby supporting the p-type semiconductor 3, n-type semiconductor 5, transparent electrically conductive material 7, and second electrically conductive material 9. In one embodiment, the p-type semiconductor 3, n-type semiconductor 5, transparent electrically conductive material 7, second electrically conductive material 9 or a combination thereof provide enough structural integrity to forgo the use of a separate substrate. Preferably, the photovoltaic device 1 is a series of layers, each layer less than 600 nm in thickness forming a thin layer (thin film). Preferably, the photovoltaic device 1 is manufactured using one of the methods described above.

The photovoltaic device 1 shown FIG. 1 is preferably combined with a plurality of such devices forming an array of photovoltaic devices. As known in the art, the photovoltaic device 1 shown FIG. 1 is just one of the myriad of devices capable of using the Bi—Se doped with Cu, p-type semiconductor. For example, transistors (e.g. BJT, MOSFET, etc.), solar cells, diodes, light-emitting diode, silicon controlled rectifier, digital and analog integrated circuits, thermoelectric devices and quantum computing devices may be constructed using the Bi—Se doped with Cu, p-type semiconductor. However, due to the optimal absorption characteristics and low cost, the p-type semiconductor is preferably used as a material in a photovoltaic device.

FIG. 2

Figure 2:
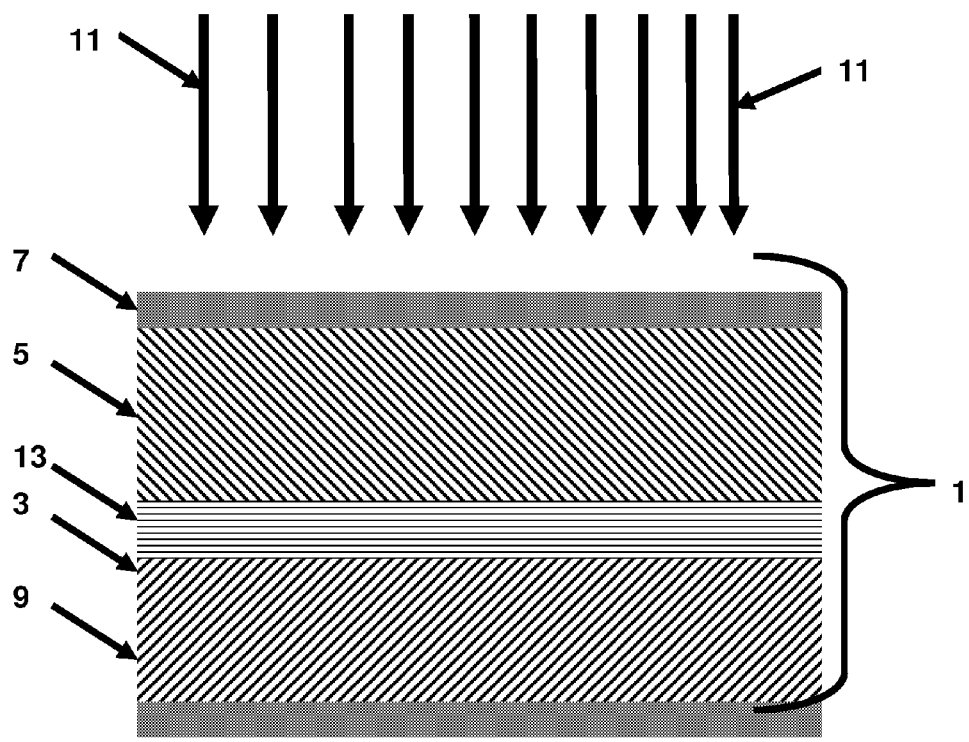
FIG. 2 shows one embodiment of a photovoltaic device using a Bi—Se doped with Cu, p-type semiconductor having a transition semiconductor layer.

FIG. 2 shows one embodiment of a photovoltaic device using a Bi—Se doped with Cu, p-type semiconductor having a transition semiconductor layer. In this embodiment, a Bi—Se doped with Cu, p-type semiconductor 3 is positioned juxtapose to a semiconductor transition layer 13. The semiconductor transition layer 13 is the positioned juxtapose to an n-type semiconductor 5. A transparent electrically conductive material 7 is positioned juxtapose to the n-type semiconductor 5. A second electrically conductive material 9 is positioned juxtapose to the p-type semiconductor 3. Preferably, a third electrically conductive layer (not shown for simplicity), as described above, is positioned juxtapose to the transparent electrically conductive material 7. Light 11 from an external source (not shown for simplicity) will pass into the n-type semiconductor 5, p-type semiconductor 3, semiconductor transition layer 13, or a combination thereof. The p-type semiconductor 3, n-type semiconductor 5, transparent electrically conductive material 7, second electrically conductive material 9, and Light 11 are the same as described above.

The semiconductor transition layer 13 is a semiconductor having a mixture of p-type and n-type semiconductor properties. Preferably, the semiconductor transition layer 13 is a Bi—Se doped with Cu semiconductor. In a preferred embodiment, the semiconductor transition layer 13 is a Bi—Se doped with Cu semiconductor having a molar percentage of Cu between 20 and 28 percent.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

The invention claimed is:

1. An electronic device comprising:
   a. a p-type semiconductor comprising Bi and Se doped with Cu;
   b. said Cu in said p-type semiconductor having a molar ratio greater than 20 percent;
   c. said p-type semiconductor having the electrical properties of a p-type semiconductor;
   d. an n-type semiconductor;
   e. a transparent electrically conductive material positioned juxtapose to said n-type semiconductor;
   f. a second electrically conductive material positioned juxtapose to said p-type semiconductor a n-type semiconductor; and
   g. said p-type semiconductor and said n-type semiconductor positioned between said transparent electrically conductive material and said second electrically conductive material.

2. The electronic device of claim 1 whereby:
   a. said Se in said p-type semiconductor has a molar ratio less than 61 percent; and
   b. said Bi in said p-type semiconductor has a molar ratio greater than 17 percent.

3. The electronic device of claim 1 whereby:
   a. said Cu in said p-type semiconductor has a molar ratio greater than 28 percent.

4. The electronic device of claim 1 whereby:
   a. said p-type semiconductor has a thickness less than 600 nanometers.

5. The electronic device of claim 1 whereby:
a. the ratio of the molar percentage of Cu in said p-type semiconductor divided by the molar percentage of Bi in said p-type semiconductor is greater than 1.2.

6. The electronic device of claim 1 whereby:
a. said Cu in said p-type semiconductor has a molar ratio of 28.4 percent;
b. said Bi in said p-type semiconductor has a molar ratio of 19.0 percent; and
c. said Se in said p-type semiconductor has a molar ratio of 52.5 percent.

7. The electronic device of claim 1 whereby:
a. said Cu in said p-type semiconductor has a molar ratio of 27.6 percent;
b. said Bi in said p-type semiconductor has a molar ratio of 19.9 percent; and
c. said Se in said p-type semiconductor has a molar ratio of 52.4 percent.

8. The electronic device of claim 1 whereby:
a. said Cu in said p-type semiconductor has a molar ratio of 27.4 percent;
b. said Bi in said p-type semiconductor has a molar ratio of 20.2 percent; and
c. said Se in said p-type semiconductor has a molar ratio of 52.4 percent.

9. The electronic device of claim 1 whereby:
a. said Cu in said p-type semiconductor has a molar ratio of 27.4 percent;
b. said Bi in said p-type semiconductor has a molar ratio of 16.3 percent; and
c. said Se in said p-type semiconductor has a molar ratio of 56.2 percent.

10. The electronic device of claim 1 whereby:
a. said Cu in said p-type semiconductor has a molar ratio of 26.9 percent;
b. said Bi in said p-type semiconductor has a molar ratio of 17.1 percent; and
c. said Se in said p-type semiconductor has a molar ratio of 55.9 percent.

11. The electronic device of claim 1 whereby:
a. said Cu in said p-type semiconductor has a molar ratio of 22.1 percent;
b. said Bi in said p-type semiconductor has a molar ratio of 18.3 percent; and
c. said Se in said p-type semiconductor has a molar ratio of 59.5 percent.

12. The electronic device of claim 1 whereby:
a. said Cu in said p-type semiconductor has a molar ratio of 21.6 percent;
b. said Bi in said p-type semiconductor has a molar ratio of 17.6 percent; and
c. said Se in said p-type semiconductor has a molar ratio of 60.8 percent.

13. The electronic device of claim 1 further comprising:
a. said n-type semiconductor comprises Bi—Se doped with Cu.

14. The electronic device of claim 1 further comprising:
a. said n-type semiconductor comprises Bi—Se doped with Cu having a molar ratio of Cu less than or equal to 28 percent.

15. The electronic device of claim 1 further comprising:
a. said n-type semiconductor comprises Bi—Se doped with Cu having a molar ratio of Cu less than or equal to 20 percent.

16. The electronic device of claim 1 further comprising:
a. a semiconductor transition layer positioned between said p-type semiconductor and said n-type semiconductor.

17. The electronic device of claim 16 further comprising:
a. said semiconductor transition layer comprises Bi—Se doped with Cu having a molar ratio of Cu between 20 and 28 percent.

18. The electronic device of claim 1 further comprising:
a. said Cu in said p-type semiconductor has a molar ratio greater than 28 percent; and
b. said n-type semiconductor comprises Bi—Se doped with Cu having a molar ratio of Cu less than or equal to 20 percent.

19. The electronic device of claim 18 further comprising:
a. a semiconductor transition layer positioned between said p-type semiconductor and said n-type semiconductor; and
b. said semiconductor transition layer comprises Bi—Se doped with Cu having a molar ratio of Cu between 20 and 28 percent.

* * * * *